United States Patent [19]
Cobaugh, deceased et al.

[11] Patent Number: 4,753,601
[45] Date of Patent: Jun. 28, 1988

[54] CIRCUIT BOARD THICKNESS COMPENSATOR

[75] Inventors: Robert F. Cobaugh, deceased, late of Elizabethtown, by Jacqueline Cobaugh, executor; Jon F. Kautz, Camp Hill, all of Pa.

[73] Assignee: AMP Incorporated, Harrisburg, Pa.

[21] Appl. No.: 639,604

[22] Filed: Aug. 10, 1984

Related U.S. Application Data

[63] Continuation-in-part of Ser. No. 541,847, Oct. 14, 1983, abandoned.

[51] Int. Cl.[4] .............................. H01R 23/72
[52] U.S. Cl. ...................... 439/62; 29/837; 439/559; 439/572
[58] Field of Search ............. 339/17 R, 17 C, 17 L, 339/17 E, 17 T, 17 LC, 94 R, 94 A, 93 R, 126 RS, 126 R, 128; 277/226; 29/739, 747, 845, 842, 837–839; 439/62, 559, 572

[56] References Cited

U.S. PATENT DOCUMENTS

| | | | |
|---|---|---|---|
| 2,659,061 | 11/1953 | Mirabella | 339/93 R |
| 2,910,209 | 10/1959 | Nelson | 277/226 |
| 3,290,639 | 12/1966 | Driemeyer | 339/94 R |
| 3,530,422 | 9/1970 | Goodman | 339/17 L |
| 3,735,466 | 5/1973 | Jensen | 29/203 B |
| 3,793,720 | 2/1974 | Van Rijsewijk et al. | 29/739 |
| 3,800,416 | 4/1974 | Schultz, Jr. | 29/625 |
| 4,394,795 | 7/1983 | Goss | 29/747 |

FOREIGN PATENT DOCUMENTS

1230516 5/1971 United Kingdom ......... 339/126 RS

*Primary Examiner*—Neil Abrams
*Attorney, Agent, or Firm*—Allan B. Osborne

[57] ABSTRACT

Connector housings having as an integral part thereof, compensators to accommodate variation in circuit board thickness to enable a plurality of connectors to be mounted thereon simultaneously. More particularly, the compensators include depending, collapsible projections on the bottom surfaces of the housings which are selectively collapsed in response to the thickness of the board at each mounting site.

3 Claims, 3 Drawing Sheets

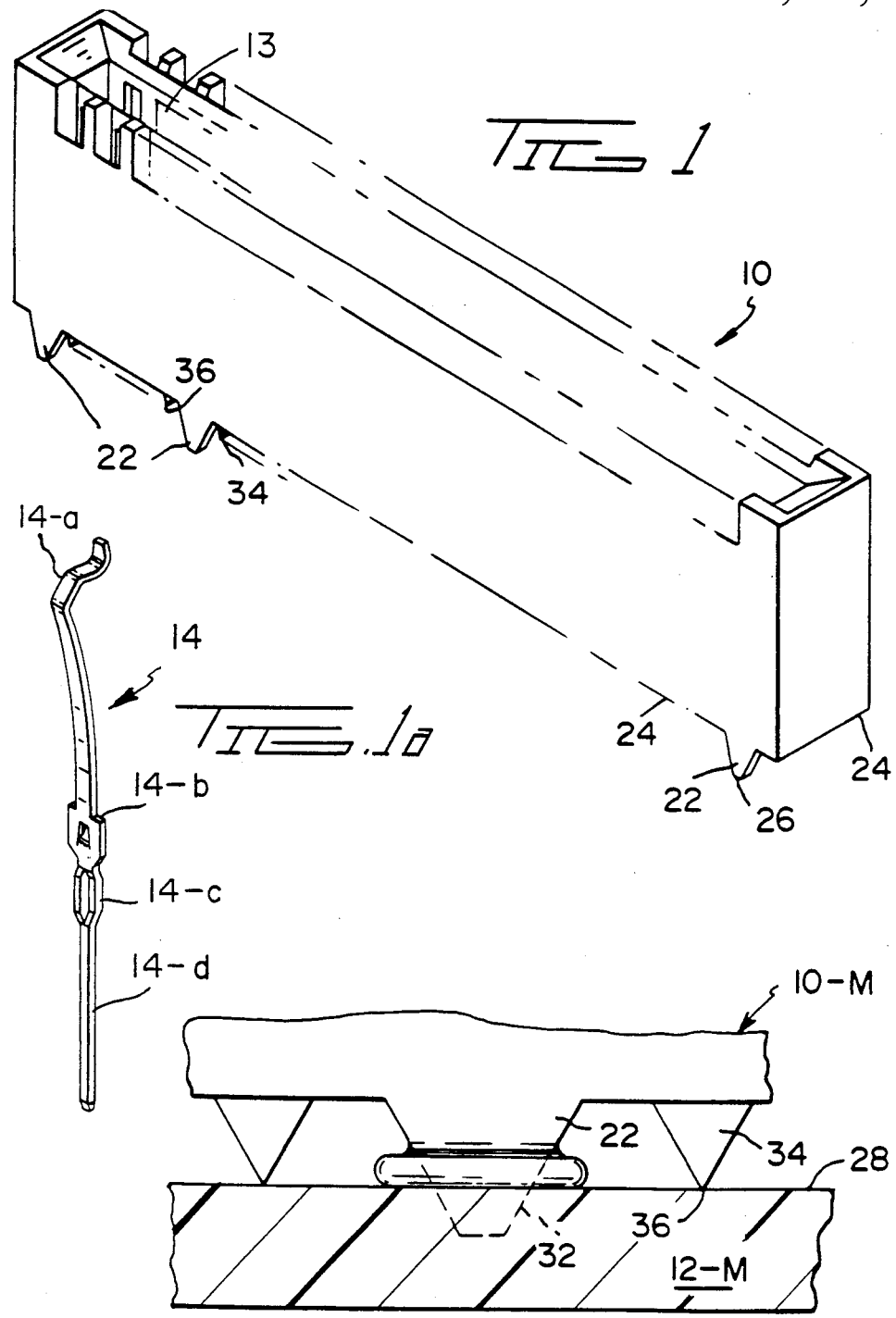

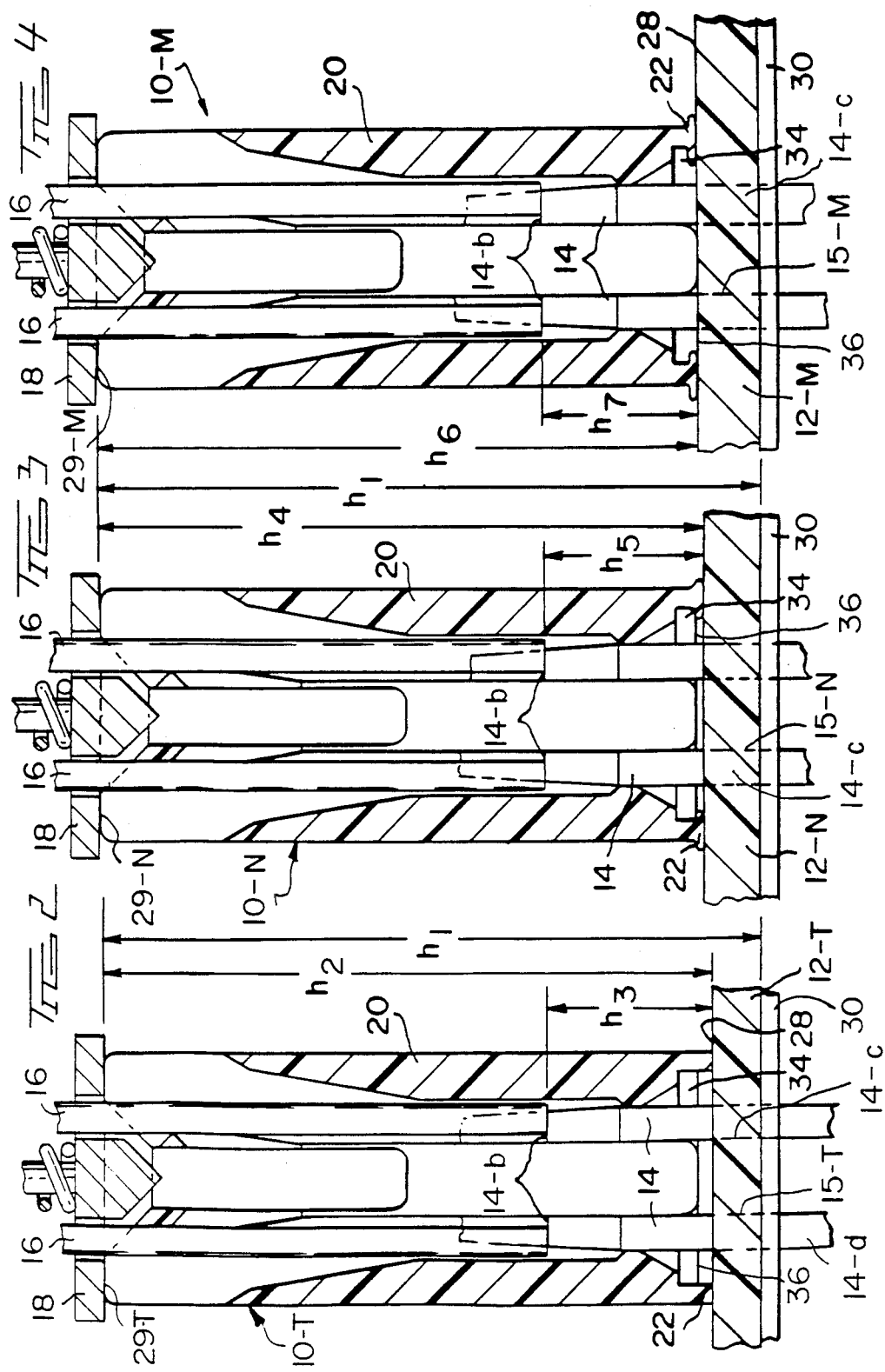

CIRCUIT BOARD THICKNESS COMPENSATOR

This application is a continuation-in-part of application Ser. No. 541,847 filed Oct. 14, 1983, now abandoned.

This invention is related to mounting connectors and the like on panels such as printed circuit boards. A problem with circuit boards is that they vary in thickness not only from board to board, but more importantly within a single board. With an acceptable ten percent in manufacturing tolerances, a board having a stated thickness of 0.093 inches (2.36 mm) may have thin sites of 0.0837 inches (2.12 mm) and thick sites of 0.1023 inches (2.60 mm). Accordingly, with an insertion press set for a 0.093 inch board, connectors being mounted on thin sites will not be fully seated and thus unstable while connectors being mounted on thick sites could sustain damage from being over-seated. Further, the connectors will extend unevenly above the board and the wire wrapping posts associated therewith will extend unevenly below the board. U.S. Pat. No. 4,367,583 provides a solution for inserting individual card edge connectors into such circuit boards. That patent discloses a press in which a pair of sensors are incorporated to sense the thickness of the circuit board in the immediate vicinity of the connector insertion site in order to precisely control the limit of descent of the press platen on which is positioned the insertion tool or head. Accordingly, the connector will be properly mounted on the board.

Gang or mass insertion, as opposed to single connector-by-connector insertion, has been a desired goal for some time. In gang insertion, a press platen carries a number of insertion tools equal to the number of connectors which can be inserted into a given board. For example, an experimental press has been built by Applicants' assignee with seventeen tools to insert that number of connectors (utilizing Applicants' invention disclosed herein) into one board. The connectors, each having one hundred contact elements, are spaced apart on centerlines of 1.5 inches (38.10 mm). Prior to the present invention, the problem with board thickness as noted above has been a deterrent to gang insertion. The teachings of the aforementioned patent, while providing an excellent solution for inserting individual connectors, cannot be adapted for gang insertion in that its solution lies in selecting the extent of press travel for each individual connector.

The present invention is, therefore, intended to provide a solution which allows the insertion of a number of connectors simultaneously into a single or several circuit boards arranged side by side such that the connectors will be properly seated regardless of the thickness variations of a board or boards.

A circuit board thickness compensator is, according to the present invention therefore, characterized by providing means on the bottom of the card edge connector which will just touch the surface of a thin board and will be collapsed or otherwise reduced in height on a thick board.

For better understanding of the invention, reference will now be made by way of example to the accompanying drawings, in which:

FIG. 1 is an isometric view of a card edge connector with the preferred embodiment of the circuit board thickness compensators of the present invention; FIG. 1-a is an isometric view of a contact element housed in the connector of FIG. 1;

FIGS. 2, 3 and 4 are cross-sectional views of the card edge connector of FIG. 1 mounted on thin, normal and thick circuit board sites respectively;

FIG. 5 is a side view showing in enlargement the deformation of a preferred board thickness compensator.

Figures 6, 7:
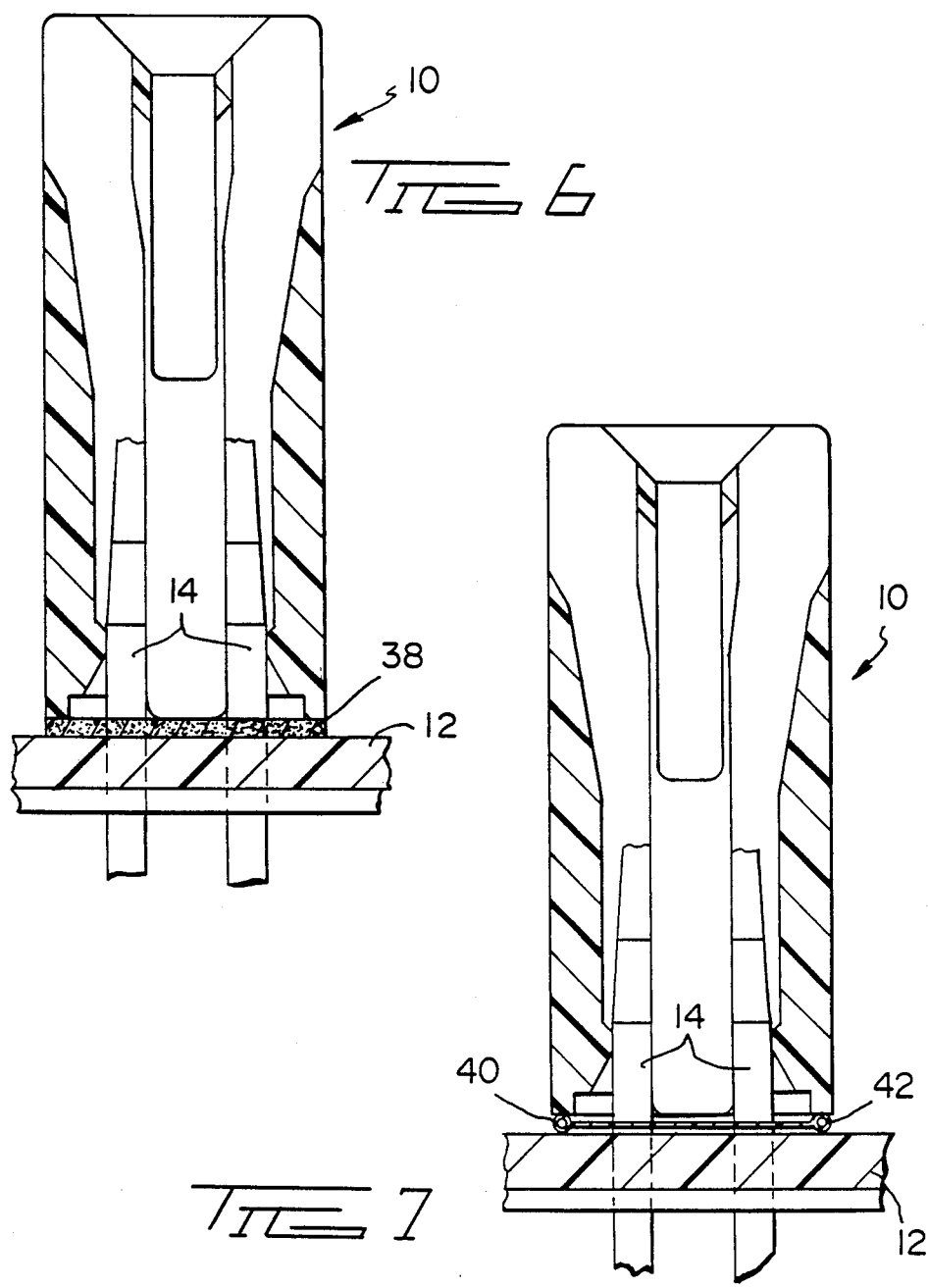
FIGS. 6 and 7 are cross-sectional views of card edge connectors with alternative embodiments of circuit board thickness compensators.

Card edge connector 10, shown in FIGS. 1 through 5, exemplifies one type of connector which is mounted on a panel such as a printed circuit mother board 12 (FIGS. 2 through 7) and has a slot 13 entering into the housing from the top surface and into which a daughter card (not shown) may be inserted. This type of connector, sold by AMP Incorporated of Harrisburg, Pennsylvania under the trademark PACE, includes a housing made from plastic sold by General Electric Company under the trademark VALOX. Contact elements 14 are staked in the housing with contact beams positioned on each side of slot 13. These elements provide the electrical connection between the daughter card and mother board. As shown in FIG. 1a, each contact element includes the aforementioned card engaging contact beam 14-a, upwardly facing shoulders 14-b, compliant section 14-c and a wire wrap post 14-d. The shoulders are located in the housing below the slot while the compliant section and post extend downwardly from the bottom surface of the housing. The connector is mounted on the board by forcefully inserting compliant section 14-c into a plated-through hole 15 (FIG. 2) with post 14-d extending below the board.

Insertion requires a powered press (not shown) with a platen on which an insertion tool is positioned. One such tool is disclosed in U.S. Pat. No. 4,383,361. It includes push pins 16 and a spring loaded guide bar or locator 18 (FIGS. 2, 3, 4).

The preferred single insertion procedure begins with placing the panel or board on the bed of the press. A connector is manually placed on the panel or board with posts 14-d in the plated through holes and the compliant sections 14-c at the openings thereto. As the insertion tool is lowered, the locator engages the top face of the connector as shown in FIGS. 2, 3 and 4 to straighten it if required and to guide the push pins down to land on shoulders 14-b. Pressure on the shoulders drive the compliant sections into the plated-through holes. The amount of pressure required to mount a connector having one hundred contact elements is about 3000 pounds. Under ideal conditions, the connector or more particularly, housing 20, will not experience any significant force on it through the locator.

Gang insertion is defined as inserting a number of connectors simultaneously into a panel such as a circuit board. The platen carries at least the same number of insertion tools as the number of connectors being inserted. As with a single insertion, the connectors are manually mounted on the board positioned on the bed with posts 14-d extending through holes 15 and with the compliant sections being at the hole entrance. The connectors are then seated simultaneously by lowering the insertion tools. As noted above, however, with board thickness varying between connector mounting sites and between boards in a multiple board applications and with the press by necessity traveling downwardly to the same depth for all connectors, some connectors will be incompletely seated and others will be over-seated. The present invention overcomes this problem without requiring complicated accessories and enables the user to set the length of the downward stroke of the press for a board having an average or normal thickness.

With specific reference to FIG. 1, the preferred circuit board thickness compensators are depending, collapsible projections 22 spaced along the bottom of connector 10 on outer edges 24. The projections may have blunt tips 26 as shown or may have some other shape, e.g., rounded or sharp. In the preferred embodiment, the projections are integral with the housing and are molded as a part thereof. The length of the collapsible projections are preferably such that the tip 26 just touches the surface of a thin board site, such as shown in FIG. 2, after insertion.

With specific reference now to FIGS. 2, 3 and 4, the utility of the circuit board thickness compensators will be disclosed in more detail. As noted above, FIG. 2 illustrates a connector 10-T after being mounted on a thin board site 12-T. Projections 22 just touch surface 28 of board 12. The top or upper surface 29-T of connector 10-T is at a height $h_1$ above the surface of press bed 30, i.e., the underside of board 12, and a height $h_2$ above board surface 28. The height $h_2$ is the actual height of connector 10-T which is 0.811 inches (20.6 mm). This includes a preferred projection height of 0.026 inches (0.66 mm). Shoulders 14-$b$ on contact elements 14 are at a height $h_3$ above board surface 28. The projections serve a useful function in this case by stabilizing the connector which otherwise could be moved or rocked laterally and they also prevent the connector from being pushed down during insertion of a daughter card.

FIG. 3 illustrates the case where a connector 10-N has been mounted on a board site 12-N having a normal thickness; i.e., the design thickness. Because the site is slightly thicker than thin board site 12-T, projections 22 were crushed or collapsed by an amount equal to the increased thickness of board site 12-N over board site 12-T. Height $h_4$, the connector height after insertion, is reduced relative to connector 10-T height by that amount. However, the top surface 29-N is at the same height $h_1$ from the top of bed 30, i.e., the underside of board 12, as is top surface 29-T of connector 10-T. In other words, both connectors are at the same height and one is not extending above the other. Shoulders 14-$b$ in connector 10-N will be closer to the top surface 28 of board 12; i.e., $h_5$ is less than $h_3$. The effect of this is that the compliant section 14-$c$ is positioned deeper within the plated-through hole 15-N but well above the opening on the underside of the board.

The board site in FIG. 4, referenced by numeral 12-M, represents one having a maximum thickness. Accordingly, in mounting connector 10-M thereon, projections 22 were crushed even more than in the FIG. 3 case. The heights $h_6$ and $h_7$ will accordingly be less than counterparts $h_2$, $h_4$ and $h_3$, $h_5$ respectively. However, the height from bed surface 30 or the underside of the board to the top surface 29-M of connector 10-M is the same as for connectors 10-T and 10-N, i.e., height $h_1$. Here again, the compliant section 14-$c$ has been driven even deeper into plate-through hole 15-M but is still above the underside opening.

The pressure required to insert the compliant sections into the plated-through holes on thin site 12-T under ideal conditions is not any more than required to insert the compliant sections on a connector without projections 22. Accordingly, substantially the total driving force is taken on upwardly facing shoulders 14-$b$ on contact elements 14. Naturally, the collapsing of the preferred embodiment projections require additional pressure. As this additional pressure increases, some of the driving force will be on the housing of the connector through locator 18 bearing down on the top thereof. Tests show that an additional pressure of about 350–400 pounds is required to fully seat a connector 10-M on a maximum thickness board with the connector having twenty two (eleven per side) projections 22. Each projection was 0.025 inches long (0.64 mm), 0.030 inches thick (0.76 mm), and 0.050 inches wide (1.27 mm) at its attachment to the housing. On a normal thickness board site the housing will see about 175–200 pounds pressure.

The aforementioned additional insertion pressures can be changed by varying the number, shape and thickness of the projections and the material used in molding the connector housing. The former variables are preferred in that the effects are much easier to ascertain. As those in the connector art know, the choice of housing material is limited and must be carefully selected due to a considerable number of other factors such as molding operations, moisture absorption, strength, and susceptibility to ultraviolet light just to name a few.

In summary, the use of the disclosed invention results in the top surfaces of all connectors gang mounted on a mother board having varying thicknesses will be at a same height relative to an even plane, e.g., the press bed or the underside of that board. Further, and as important, the wire wrapping posts 14-$d$ will extend below the board for the same distance. Still another important result is that the card slot floors of all connectors will be on the same horizontal plane.

FIG. 5 is an enlarged view of a projection 22 showing it collapsed (solid lines) and its original, non-crushed shape in dashed lines indicated by reference numeral 32. As shown in the drawing, the collapsing is in the manner of mushrooming. Tests indicate that cracking does not occur in the material. This Figure and FIG. 1 also show ribs 34 which extend across the bottom surface of connectors 10. These ribs provide a stand-off between the board and connector and are not structurally or functionally the same as projections 22. With reference to FIG. 4, the free end 36 of these ribs just barely touch or are just barely above board surface 28 of board site 12-M. In cases of thinner board sites 12-T and 12-N, these ribs are above board surface 28.

FIGS. 6 and 7 illustrate two other kinds of compensators which differ from the above by being separate components. The compensator shown in FIG. 6, indicated by reference numeral 38, is a crushable foam or sponge-like material. Compensator 40 shown in FIG. 7 is a strip of plastic with the edges formed into tubes 42. The tubes compensate for board thickness by being squeezed or crushed as set forth with regard to compensators 22.

The invention has been described using card edge connectors. However, other types of connectors or devices which have similar problems in being mass inserted will benefit from the use of the invention as well.

What is claimed is:

1. A plurality of connectors mounted on one surface of a panel such as a printed circuit board, each connector comprising a housing having top and bottom surfaces with the latter facing and immediately adjacent the one surface of the panel and the former facing away therefrom, each of the housings containing a plurality of contact elements with compliant sections thereon extending from the bottom surface and inserted in holes in the panel by pressing on the contact elements and/or on the top surface of the housing, the connectors being characterized in that the housings have collapsible projections extending from the bottom surface to be selectively collapsed during insertion of the compliant sections in compensation for varying thicknesses in the mounting sites on a panel which are greater than those mounting sites having minimum thickness so that the top surfaces of the housings are precisely coplanar irregardless of the mounting site thicknesses.

2. The connectors of claim 1 wherein the contact elements include wire wrapping posts attached to the compliant sections, the connectors being further characterized by the posts passing through the holes in the panel and the free ends thereof being at the same distance relative to each other from the panel.

3. A method of simultaneous mounting a plurality of connectors onto a panel such as a printed circuit board so that the top surfaces of the connectors are precisely coplanar, each connector comprising a housing having top and bottom surfaces and carrying a plurality of contact elements with compliant sections thereon extending from the bottom surface, the method comprising the steps of:
   a. providing collapsible projections on the bottom surface of the housings;
   b. placing a panel on a bed of a press and under a descendible platen having a plurality of insertion tools fixed thereto;
   c. placing the connectors on the panel with the compliant sections in alignment with holes therein;
   d. inserting the compliant sections into the holes by lowering the platen to a predetermined height above the bed of the press with the insertion tools pushing on the contact elements and/or the top surface of the housing; and
   e. selectively collapsing the projections on the housing by pressure being applied thereto by the insertion tools to compensate for variations in the thickness of the mounting sites which are greater than the minimum thickness of the panel.

* * * * *